(12) United States Patent
Cucchi

(10) Patent No.: US 7,313,748 B2
(45) Date of Patent: Dec. 25, 2007

(54) FEC DECODER AND METHOD

(75) Inventor: Silvio Cucchi, Gaggiano (IT)

(73) Assignee: Alcatel, Paris (FR)

( * ) Notice: Subject to any disclaimer, the term of this patent is extended or adjusted under 35 U.S.C. 154(b) by 365 days.

(21) Appl. No.: 10/671,558

(22) Filed: Sep. 29, 2003

(65) Prior Publication Data
US 2004/0123219 A1  Jun. 24, 2004

(30) Foreign Application Priority Data
Oct. 31, 2002  (EP)  ................... 02292722

(51) Int. Cl.
*H03M 13/00* (2006.01)
(52) U.S. Cl. .................................. 714/760
(58) Field of Classification Search ............... 714/760, 714/746, 748, 751, 754, 758, 796, 800
See application file for complete search history.

(56) References Cited

U.S. PATENT DOCUMENTS

| | | | | |
|---|---|---|---|---|
| 4,001,692 A | * | 1/1977 | Fenwick et al. | ............ 714/797 |
| 5,229,997 A | * | 7/1993 | Hirata et al. | ................ 370/324 |
| 5,745,506 A | * | 4/1998 | Yamashita et al. | .......... 714/760 |
| 6,032,283 A | * | 2/2000 | Meyer | ......................... 714/746 |
| 6,268,767 B1 | * | 7/2001 | Maalej et al. | ................ 329/304 |
| 6,269,124 B1 | * | 7/2001 | Nagayasu et al. | .......... 375/262 |
| 6,397,368 B1 | * | 5/2002 | Yonge et al. | ............... 714/792 |
| 6,606,343 B2 | * | 8/2003 | Zeira et al. | ................. 375/130 |

FOREIGN PATENT DOCUMENTS

| | | |
|---|---|---|
| EP | 0 136 604 A2 | 4/1985 |
| EP | 0 317 197 A2 | 5/1989 |
| EP | 0 984 575 A2 | 3/2000 |

* cited by examiner

*Primary Examiner*—Shelly Chase
*Assistant Examiner*—Fritz Alphonse
(74) *Attorney, Agent, or Firm*—Sughrue Mion, Pllc.

(57) ABSTRACT

A method is described for FEC decoding a signal which has become affected by transmission errors, the original signal being transmitted together with parity data. The method comprises: receiving (5) the original signal (DATA) and parity data (ECC DATA) with errors; checking (6) for integrity thereof; and counting and locating the errors (7). The method is characterized by comprising: setting at leat one error threshold; comparing (11) the number of counted errors with the set threshold; and performing the correction (8) only in case the number of counted errors is lower than the threshold. Through the present invention, the problem of introduction of further errors during the decoding step is advantageously avoided.

15 Claims, 3 Drawing Sheets

(prior-art)**

FEC DECODER AND METHOD

INCORPORATION BY REFERENCE OF PRIORITY DOCUMENT

This application is based on and claims the benefit of the European Patent Application No. 02 292 722.2 filed on Oct. 31, 2002, which is incorporated by reference herein.

BACKGROUND OF THE INVENTION

1. Field of the Invention

The present invention relates to the telecommunication field and more in particular to the art of error correction which could be originated during the transmission of signals. Still more in particular, the present invention relates to an improved FEC decoder and an improved method for decoding signals.

2. Description of the Prior Art

As it is known, the Forward Error Correction (FEC) is a technique by means of which redundancy is transmitted together with transported data, using a pre-determined algorithm. The receiving device has the capability of detecting and correcting multiple bit errors that could occur during transmission thanks to the redundancy. The signal transmitted with FEC is more "robust" thus allowing operators to build up longer distance connections without the deployment of many repeater stations.

In other words, in order to overcome transmission errors and packet loss, many telecommunication systems use forward error correction (FEC). In general, FEC schemes transmit extra data which can be used at the receiving end to re-create any corrupted or lost packets. For instance, FEC has been applied to CD-ROMs to compensate for scratches, and used in satellite and deep-space transmissions, since the broadcast is in only one direction (i. e. the receiver is incapable of asking for retransmission).

Many of these systems use the Reed-Solomon algorithm, which is primarily designed to take an arbitrary stream of data and restore any corrupted section therein, with the appropriate amount of error correction contained in the stream. In order for the algorithm to recover data that has been corrupted or lost in an arbitrary location, the algorithm must include enough error correction to compensate for the fact that some error correction may not be received at the receiving end as well (i. e. the algorithm needs to be able to account for the fact that both data and error correction may be lost).

As it is known, a FEC code based decoder is designed for correcting a fixed maximum number of symbols in a codeword. For instance, a Reed-Solomon FEC could correct up to 4 symbols in a codeword. This means that in case the number of errored symbols is less than or equal to four, all the symbols can be corrected and the codeword can be correctly reconstructed.

The problem arises when the number of errored symbols is higher than the fixed maximum number, for instance, higher than four in the above example. If this is the case, the errors could be wrongly corrected and, furthermore, a high number of additional errors can be introduced.

In general terms, the telecommunication channels could be divided into two different categories as far as the introduction of errors is concerned. Channels introducing error bursts (for instance the radio channels) and channels introducing errors in a random manner (for instance, optical channels). If the second category of channels is considered, the number of errored bits in 4 symbols is around 4 (typically, 4 or 5).

If the symbols are 8-bit long, the average number of introduced errors (in bits) is (symbols×8)/2, where "symbols" is the number of correctable symbols. Thus, in the above example, the mean number of introduced errors is (4×8)/2=16 and the maximum number is 32. The man skilled in the art will easily understand that the introduced errors are well higher than the average number of errors ($\cong$4-5 errors). In the present example, if the number of errors that the decoder tries to correct is well higher than 4 or 5, it is highly possible that a wrong correction is performed and new errors are introduced.

SUMMARY OF THE INVENTION

In view of the above disadvantages, the main object of the present invention is overcoming them in an efficient manner.

A further object of the present invention is providing an improved FEC decoder which does not introduce further errors also when the number of symbols containing errors is higher than a fixed number of correctable errored symbols.

A still further object of the present invention is providing an improved FEC decoding method which does not introduce further errors also when the number of symbols containing errors is higher than a fixed number of correctable errored symbols.

The above and further objects are obtained by a method according to claim 1 and a decoder according to claim 5. Further advantageous features of the present invention are set forth in the respective dependent claims. All the claims are considered as an integral part of the present description.

The basic idea of the present invention consists in not carrying out any error correction should the number of errors be higher than a certain threshold. Possibly, the correction could be performed in a different step if a recursive/iterative decoder is used.

BRIEF DESCRIPTION OF THE DRAWINGS

The invention will become clear from the following detailed description, given by way of non-limiting example, to be read with reference to the attached figures, wherein.

BEST MODE FOR CARRYING OUT THE INVENTION

Figure 1:
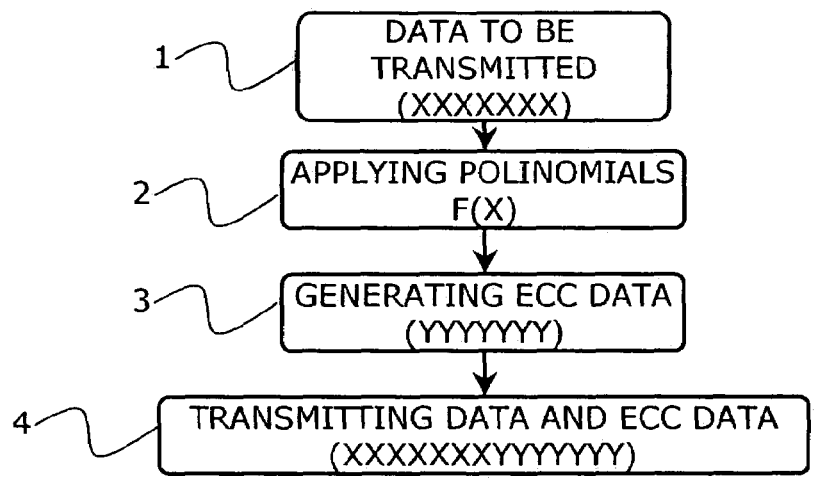
FIG. 1 is a block diagram of the basic steps (applied to a single codeword), in transmission, of a FEC procedure according to the state of the art.
Figure 2:
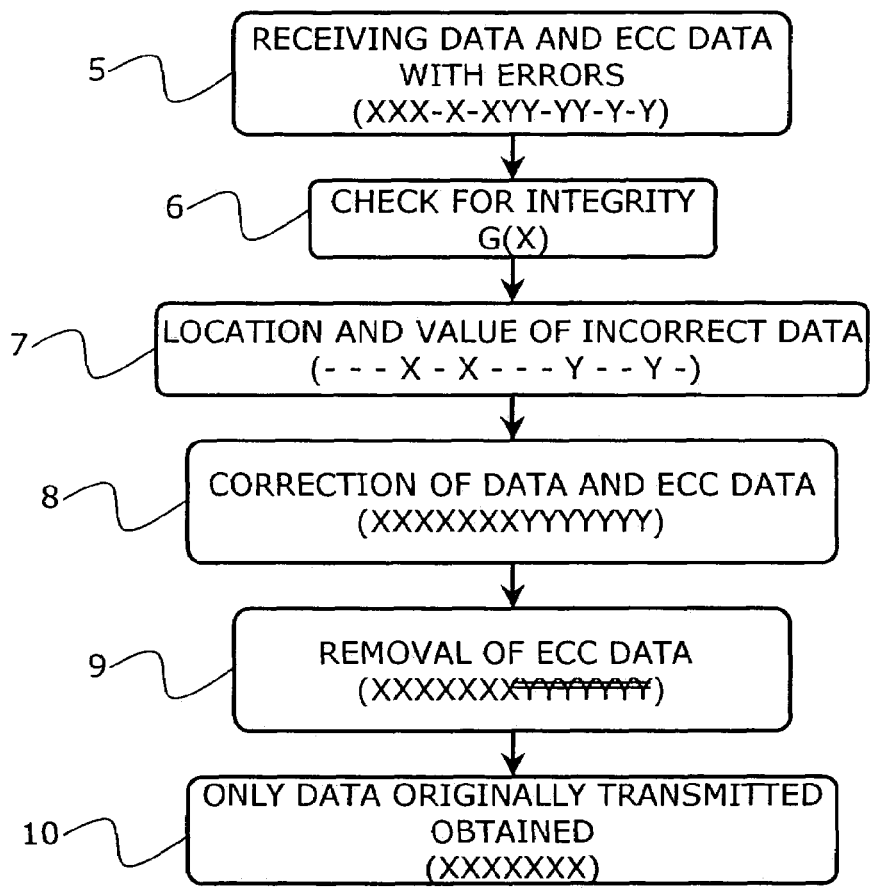
FIG. 2 is a block diagram of the basic steps (applied to a single codeword), in reception, of a FEC procedure according to the state of the art.

Forward Error Correction can be viewed as an advanced form of checksums. A set of mathematical (polynomials) equations 2 are applied to input data 1 resulting in another set of data 3. The output data 3 is called Error Correcting Code data (ECC data). Both sets of data are then transmitted (4). Upon reception (step 5), the data is checked for integrity (6) using the ECC data and the known polynomials, resulting in another piece of data 7 indicating exactly where and how the received data is incorrect and how to correct it. Note that the checking algorithm can detect discrepancies in the ECC data itself, even if it was corrupted. Finally, the ECC data is removed in step 9 and only the original data are obtained (10). This process is illustrated graphically in FIG. 2 and is valid for a single codeword.

Generally, product codes are implemented and the above steps are repeated, at least once, for all the lines and columns.

In general, the most popular set of mathematical algorithms and equations that are used to calculate the ECC data is called "Reed-Solomon" (RS), and is well known in the art, but for background, will now be described below.

Reed-Solomon codes are a subset of BCH codes and are linear block codes. A Reed-Solomon code is specified as RS (n, k) with s-bit symbols. This means that the encoder takes k data symbols of s bits each and adds parity symbols to make an n symbol codeword. There are n k parity symbols of s bits each. A Reed-Solomon decoder can correct up to t symbols that contain errors in a codeword, where 2t-n-k. In reality, a Reed-Solomon decoder can correct up to 2t symbols if the locations of the errors are already known.

Figure 4:
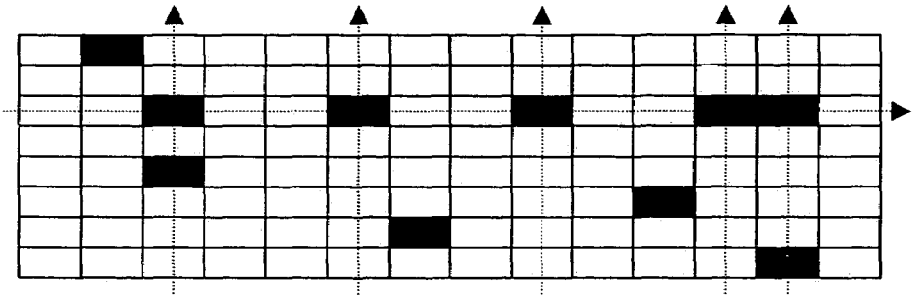
FIG. 4 is an exemplifying schematic representation of a frame of a product code.

FIG. 4 shows an exemplifying simplified signal frame of a product code with some errored symbols (in black). The frame is first checked by lines (all the lines are checked) and then by columns (all the columns are checked). When the first line codeword is checked, it is easily corrected because only one errored symbol is present. When the second line codeword is checked, no errored symbol are detected and no correction should be performed. When the first column codeword is checked, no errored symbols are detected and no correction should be performed. When the second column codeword is checked, the single errored symbol is easily corrected. And so on.

A problem arises when the third line codeword is checked. In this line the number of errored symbols is higher than the correction capacity of the code. According to the prior art solutions, the code tries to perform the correction, does not succeed in it and, furthermore, could introduce a number of new errors.

On the contrary, according to the present invention, a proper threshold value is provided. If (step 11, FIG. 3) it is detected that the number of errored bits is higher than such a threshold, the correction of the highly errored codeword is not performed (step 12).

Doing so, no further errors could be introduced. Furthermore, it could be realized that the errored symbols could be corrected also by checking the columns that are affected by the same errors, namely columns #3, #6, #9, #12 and #13.

Figure 3:
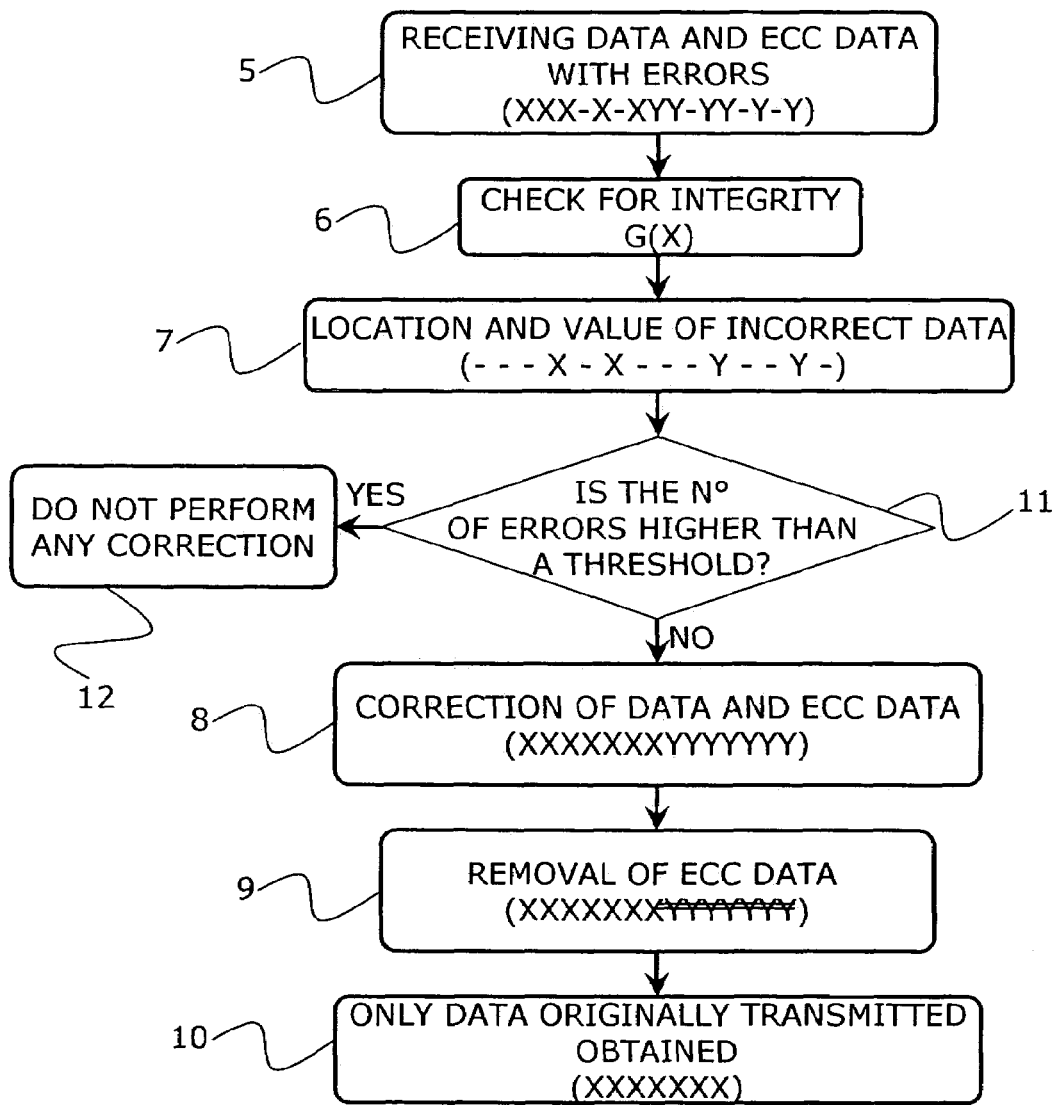
FIG. 3 is a block diagram of the basic steps, in reception, of a FEC procedure applied to a single codeword according to the present invention.

FIG. 3 is a block diagram of the steps of the method according to the present invention, applied to a single codeword.

The threshold could be the same for all the line and the column codewords. Aa a non limiting example, a threshold equal to 12 has been profitably used with a FEC correcting up to four errors.

Figure 5:
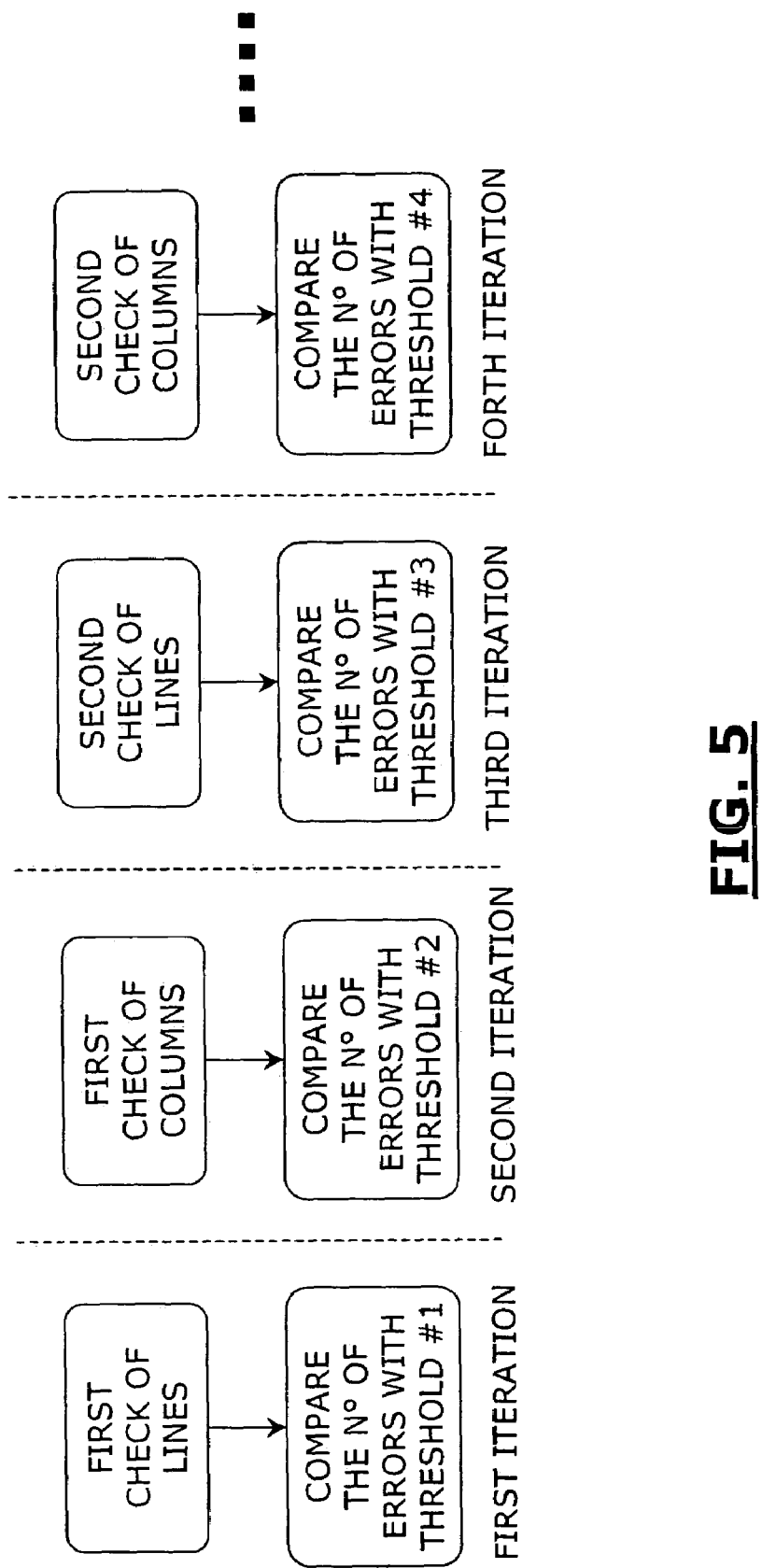
FIG. 5 shows several correction iterations that are carried out in reception and the corresponding thresholds.

Advantageously, the threshold fixed for the line codewords could be different from the one set for column codewords. A further alternative could be setting a different threshold also for each iteration. The last option is shown in FIG. 5 where, at iteration #1 (for instance, first check of lines) a first threshold is used; at iteration #2 (for instance, first check of columns), a second threshold is used; at iteration #3 (for instance, second check of lines) a first threshold is used, at iteration #4 (for instance, second check of columns), a second threshold is used, and so on.

In case a different threshold is chosen, for each single iteration, the threshold is chosen according to the below equation:

MIN (number of introduced errors+number of correctable errors that are not corrected)

The decoder according to the present invention comprises: means for receiving wanted data and parity data with errors; means for checking integrity of the received wanted data and parity data by applying proper polinomials; means providing location and value of incorrect data; means for comparing the detected errors with a proper threshold; means for, in case the detected errors are lower than the proper threshold, correcting the wanted data and parity data according to the provided location and value of incorrect data; means for removing parity data in order to finally provide the (corrected) data that were originally transmitted.

The advantages of the present invention are thus clear. With a prior art FEC mechanism (without threshold), the number of introduced errors could be as high as 300 (namely, 300 introduced errors+0 correctable errors that are not corrected). With a FEC mechanism according to the present invention, the number of introduced errors is 4 (namely, 2 introduced errors+2 correctable errors that are not corrected).

There have thus been shown and described a novel decoder and a novel method which fulfill all the objects and advantages sought therefor. Many changes, modifications, variations and other uses and applications of the subject invention will, however, become apparent to those skilled in the art after considering the specification and the accompanying drawings which disclose preferred embodiments thereof. All such changes, modifications, variations and other uses and applications which do not depart from the scope of the invention are deemed to be covered by the invention which is limited only by the claims which follow.

What is claimed is:

1. A method for Forward Error Correction decoding a signal which has become affected by transmission errors, the original signal being transmitted together with parity data, the method comprising:

receiving the original signal and the parity data with errors;

checking for integrity of the original signal using the parity data;

counting and locating the errors in the original signal and the parity data;

setting at least one error threshold;

comparing the number of counted errors with the set threshold; and performing a correction of the original signal only when the number of counted errors is lower than the set threshold, wherein different thresholds are set depending on at least one of: whether lines or columns of the original signal are checked and a number of iterative correction.

2. A method according to claim 1, wherein, when the number of counted errors is higher than the threshold, the correction of the original signal is performed in a different operation if a recursive decoder is used.

3. A method according to claim 1, wherein, the setting an error threshold comprises setting a first error threshold for checking lines of the original signal and a second error threshold for checking the columns of the original signal.

4. The method according to claim 3, wherein the first error threshold is different from the second error threshold.

5. A method according to claim 1, wherein the setting an error threshold comprises setting a different error threshold for any of the correction iterations.

6. The method according to claim 1, wherein the error threshold is a fixed maximum number of symbols in a codeword that the decoder is adapted to re-construe correctly.

7. The decoder according to claim 6, wherein, when the number of counted errors is higher than or equal to the error threshold, the decoder does not perform the correction of the original signal and wherein said correction comprises correcting faulty symbols in the original signal.

8. The method according to claim 1, wherein the setting of said at least one error threshold comprises varying the error thresholds depending on the number of the correction iteration.

9. A Forward Error Correction decoder for decoding a signal which has become affected by transmission errors, the original signal being transmitted together with parity data, the decoder comprising:
 a receiver for receiving the original signal and parity data with errors;
 a checker for checking for integrity of the original signal using the parity data;
 a counter for counting and locating the errors; and
 a comparator for comparing the number of counted errors with an error threshold,
 wherein correction of the original signal is being performed only when the number of counted errors is lower than the threshold, and
 wherein different error thresholds are set depending on at least one of: whether lines or columns of the original signal are checked and a number of iterative correction.

10. A decoder according to claim 9, wherein the error threshold comprises a first error threshold for checking the lines of the original signal and a second error threshold for checking the columns of the original signal.

11. The decoder according to claim 10, wherein the first error threshold is different from the second error threshold.

12. A decoder according to claim 9, wherein the error threshold comprises a different error threshold for any of correction iterations.

13. The decoder according to claim 9, wherein the error threshold is a fixed maximum number of symbols in a codeword that the decoder is adapted to re-construe correctly.

14. The decoder according to claim 13, wherein, when the number of counted errors is higher than or equal to the error threshold, the decoder does not perform the correction of the original signal and wherein said correction comprises correcting faulty symbols in the original signal.

15. The decoder according to claim 9, wherein the error threshold comprises different error thresholds depending on the number of the correction iteration.

* * * * *